United States Patent
Na et al.

(10) Patent No.: US 12,008,268 B2
(45) Date of Patent: *Jun. 11, 2024

(54) MEMORY DEVICE INCLUDING INTERFACE CIRCUIT AND METHOD OF OPERATING THE SAME

(71) Applicant: Samsung Electronics Co., Ltd., Suwon-si (KR)

(72) Inventors: Daehoon Na, Seoul (KR); Jeongdon Ihm, Seongnam-si (KR); Jangwoo Lee, Seoul (KR); Byunghoon Jeong, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 42 days.

This patent is subject to a terminal disclaimer.

(21) Appl. No.: 17/867,008

(22) Filed: Jul. 18, 2022

(65) Prior Publication Data

US 2022/0350541 A1 Nov. 3, 2022

Related U.S. Application Data

(63) Continuation of application No. 17/031,069, filed on Sep. 24, 2020, now Pat. No. 11,392,324.

(30) Foreign Application Priority Data

Oct. 7, 2019 (KR) .................. 10-2019-0123961

(51) Int. Cl.
*G06F 3/06* (2006.01)
*G06F 1/06* (2006.01)
(Continued)

(52) U.S. Cl.
CPC .............. *G06F 3/0659* (2013.01); *G06F 1/06* (2013.01); *G06F 3/0611* (2013.01);
(Continued)

(58) Field of Classification Search
CPC ........ G06F 3/0659; G06F 1/06; G06F 3/0611; G06F 3/0656; G06F 3/0679; G11C 16/10; G11C 16/26; G11C 16/32; G11C 16/0483
See application file for complete search history.

(56) References Cited

U.S. PATENT DOCUMENTS 7,656,984 B2    2/2010 Kim et al.
7,884,661 B2 *  2/2011 Choi ..................... G11C 7/222
                                              327/295
(Continued)

OTHER PUBLICATIONS

Extended European Search Report dated Feb. 22, 2021 in European Application No. 20199381.3.
(Continued)

*Primary Examiner* — Vanthu T Nguyen
(74) *Attorney, Agent, or Firm* — Harness, Dickey & Pierce, P.L.C.

(57) ABSTRACT

A memory system includes a memory device including a plurality of non-volatile memories and an interface circuit connected to each of the plurality of non-volatile memories, and a memory controller connected to the interface circuit and configured to transmit/receive data according to a first clock, wherein the interface circuit is configured to divide the first clock into a second clock, according to the number of the plurality of non-volatile memories, and transmit/receive data to/from each of the plurality of non-volatile memories, according to the second clock.

17 Claims, 9 Drawing Sheets

(51) Int. Cl.
   *G11C 16/10*      (2006.01)
   *G11C 16/26*      (2006.01)
   *G11C 16/32*      (2006.01)
   *G11C 16/04*      (2006.01)

(52) U.S. Cl.
   CPC .......... *G06F 3/0656* (2013.01); *G06F 3/0679* (2013.01); *G11C 16/10* (2013.01); *G11C 16/26* (2013.01); *G11C 16/32* (2013.01); *G11C 16/0483* (2013.01)

(56) References Cited

U.S. PATENT DOCUMENTS

| | | |
|---|---|---|
| 7,999,367 B2 | 8/2011 | Kang et al. |
| 8,138,799 B2 * | 3/2012 | Hayashi .................. H03L 7/085 327/12 |
| 8,447,908 B2 | 5/2013 | Bruce et al. |
| 9,570,182 B1 | 2/2017 | Yanagidaira et al. |
| 9,601,171 B2 | 3/2017 | Kim et al. |
| 10,068,624 B2 | 9/2018 | Kwon |
| 10,164,817 B2 | 12/2018 | Hollis et al. |
| 10,186,304 B2 | 1/2019 | Kang |
| 10,262,705 B2 | 4/2019 | Choi |
| 10,521,141 B2 | 12/2019 | Lee |
| 2009/0240969 A1 | 9/2009 | Chiu et al. |
| 2009/0259781 A1 | 10/2009 | Padaparambil |
| 2018/0090186 A1 | 3/2018 | Kang et al. |
| 2018/0226108 A1 | 8/2018 | Kwon |
| 2019/0080774 A1 | 3/2019 | Lee et al. |
| 2020/0342919 A1 | 10/2020 | Park et al. |

OTHER PUBLICATIONS

Non-Final Office Action dated Dec. 16, 2021 in corresponding U.S. Appl. No. 17/031,069.
Notice of Allowance dated Mar. 17, 2022 in corresponding U.S. Appl. No. 17/031,069.
Notice of Allowance dated Dec. 29, 2021 in corresponding U.S. Appl. No. 17/150,307.

* cited by examiner

MEMORY DEVICE INCLUDING INTERFACE CIRCUIT AND METHOD OF OPERATING THE SAME

CROSS-REFERENCE TO RELATED APPLICATION

This application is a continuation of U.S. application Ser. No. 17/031,069, filed on Sep. 24, 2020, which claims the benefit of Korean Patent Application No. 10-2019-0123961, filed on Oct. 7, 2019, in the Korean Intellectual Property Office, the disclosure of each of which is incorporated herein in its entirety by reference.

BACKGROUND

Example embodiments of the inventive concepts relate to a memory device. For example, at least some example embodiments relate to a memory device including an interface circuit for adaptively adjusting an internal operating frequency and/or a method of operating the memory device.

Semiconductor memory devices may be classified into volatile memory devices that lose stored data when power is interrupted and non-volatile memory devices that do not lose stored data when power is interrupted. Volatile memory devices read and write at a high speed, but lose stored content when external power supply is turned off. In contrast, non-volatile memory devices read and write at a lower speed than volatile memory devices, but retain content even when external power supply is turned off.

Also, non-volatile memories such as flash memories are widely used as storage devices in various fields due to the advantages of high capacity, low noise, and low power consumption. In particular, solid-state drives (SSDs) based on flash memories are used as mass storage devices in personal computers, notebook computers, workstations, server systems etc. General SSD devices are connected to a computing system based on a serial AT Attachment (SATA) interface or a peripheral component interconnect (PCI)-express interface. However, as data processed in a computing system has recently increased, data throughput may be greater than a data bandwidth or a communication speed of an interface connected to the non-volatile memory, thereby resulting in data bottlenecks. Such phenomena may degrade the performance of the computing systems, and various performance enhancement methods for solving the problems have been developed.

SUMMARY

Example embodiments of the inventive concepts provide a method and/or apparatus that may stably operate at a maximum operating frequency, in an interface circuit, a memory device, a memory system, and/or an operating method thereof.

According to an example embodiment of the inventive concepts, there is provided a memory system including: a memory controller configured to exchange data according to a first clock, the data including one or more of read data and write data; and a memory device including a plurality of non-volatile memories and an interface circuit connected to the memory controller and the plurality of non-volatile memories, the interface circuit configured to, divide the first clock into a second clock based on a number of the plurality of non-volatile memories, and exchange the data with the plurality of non-volatile memories, according to the second clock.

According to another example embodiment of the inventive concepts, there is provided an interface circuit device including: a divider configured to divide a first clock received from a memory controller into a second clock, and to transmit the second clock to a first non-volatile memory and a second non-volatile memory; and a serializer including, a first buffer register connected to the first non-volatile memory, a second buffer register connected to the second non-volatile memory, and a combiner configured to receive read data from each of the first buffer register and the second buffer register based on the first clock, and to output the read data to the memory controller.

According to another example embodiment of the inventive concepts, there is provided a memory device including: a plurality of non-volatile memories; and a plurality of interface circuits including, a first interface circuit of a first layer, the first interface circuit connected to a memory controller, the first interface circuit configured to exchange data with the memory controller according to a first clock; and second interface circuits of a second layer, the second interface circuits connecting the first interface circuit to the plurality of non-volatile memories, the second interface circuits configured to exchange data with the first interface circuit based on a second clock, and to exchange data with the plurality of non-volatile memories based on a third clock, the second clock corresponding to the first clock divided by a number of the second interface circuits, and the third clock being corresponding to the second clock dividing by a number of the plurality of non-volatile memories.

BRIEF DESCRIPTION OF THE DRAWINGS

Example embodiments of the inventive concepts will be more clearly understood from the following detailed description taken in conjunction with the accompanying drawings in which.

DETAILED DESCRIPTION

Example embodiments of the inventive concepts will now be described more fully with reference to the accompanying drawings, in which some example embodiments of the inventive concepts are shown.

Figure 1:
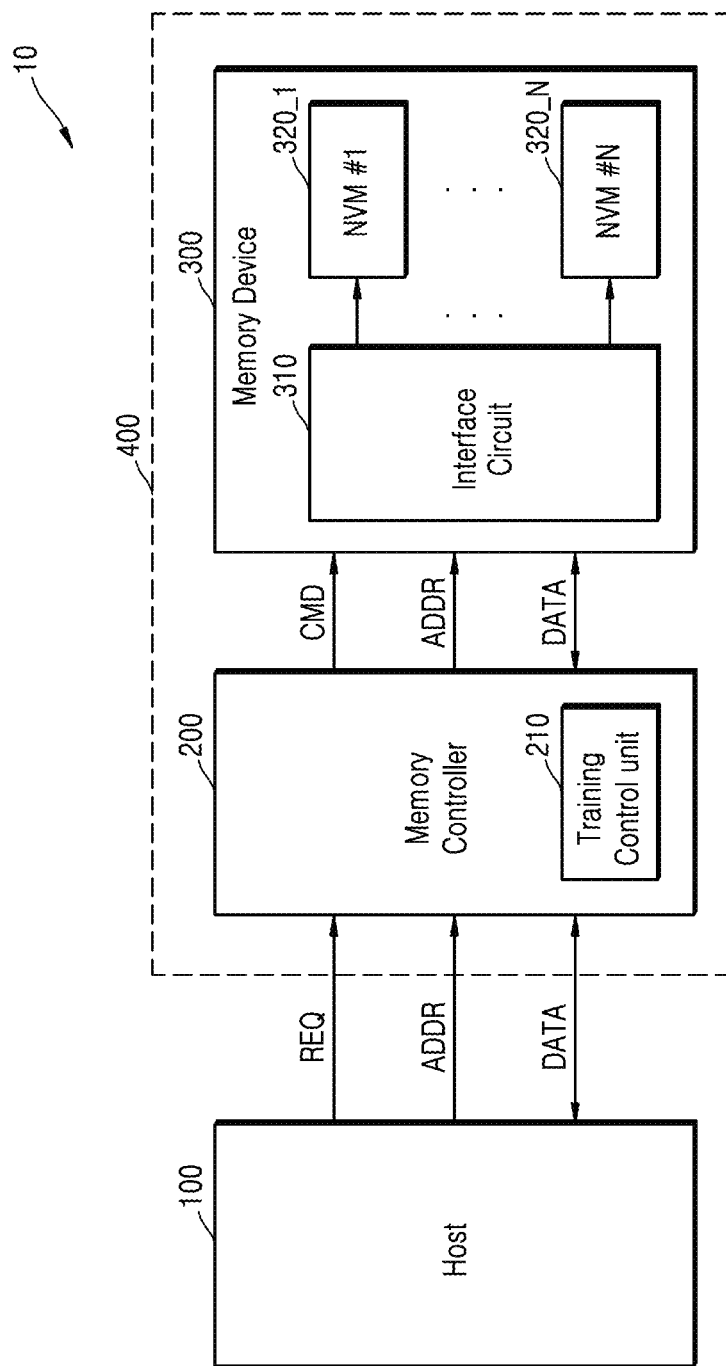
FIG. 1 is a diagram illustrating a data processing system according to an example embodiment of the inventive concepts.

FIG. 1 is a diagram illustrating a storage system 10 according to an example embodiment of the inventive concepts.

The storage system 10 may be implemented as an electronic device such as a personal computer (PC), a laptop computer, a mobile phone, a smartphone, a tablet PC, a personal digital assistant (PDA), an enterprise digital assistant (EDA), a digital still camera, a digital video camera, an audio device, a portable multimedia player (PMP), a personal navigation device (PND), an MP3 player, a handheld game console, or an e-book. Also, the storage system 10 may be implemented as an electronic device such as a wearable device such as a wristwatch or a head-mounted display (HMD).

Referring to FIG. 1, the storage system 10 may include a host 100 and a storage device 400. The storage device 400 may include a memory controller 200 and a memory device 300. The memory device 300 may include an interface circuit 310 and a plurality of non-volatile memories (e.g., first through $N^{th}$ non-volatile memories 320_1 through 320_N).

According to various example embodiments, the host 100 may send a data access request REQ to the storage device 400. For example, the host 100 may provide a data write request or a data read request to the storage device 400, and the storage device 400 may write data to the first through $N^{th}$ non-volatile memories 320_1 through 320_N according to an access request from the host 100 or may read data from the first through $N^{th}$ non-volatile memories 320_1 through 320_N and may send the data to the host 100. Also, according to a data erasure request from the host 100, the storage device 400 may perform an erasure operation on data in an area indicated by the host 100.

According to various example embodiments, the host 100 may communicate with the storage device 400 through various interfaces. The host 100 may include various types of devices capable of performing data access on the storage device 400. For example, the host 100 may be an application processor (AP) communicating with the storage device 400 based on a flash memory.

According to various example embodiments, the storage device 400 may be an internal memory embedded in an electronic device. For example, the storage device 400 may be an embedded universal flash storage (UFS) memory device, an embedded multi-media card (eMMC), or a solid-state drive (SSD). The storage device 400 may be embedded in the same substrate as the host 100. In some example embodiments, the storage device 400 may be an external memory detachable from the electronic device. For example, the storage device 400 may include at least one of a UFS memory card, a compact flash (CF) card, a secure digital (SD) card, a micro-secure digital (SD) card, a mini-secure digital (SD) card, an extreme digital (xD) card, and a memory stick.

According to various example embodiments, the storage device 400 may include the memory controller 200 and the memory device 300, and the memory device 300 may include the interface circuit 310 and the first through $N^{th}$ non-volatile memories 320_1 through 320_N.

According to various example embodiments, the memory controller 200 may write write data to the first through $N^{th}$ non-volatile memories 320_1 through 320_N in response to a write request received from the host 100, or may receive read data from the first through $N^{th}$ non-volatile memories 320_1 through 320_N in response to a read request received from the host 100.

According to various example embodiments, the interface circuit 310 may connect the first through $N^{th}$ non-volatile memories 320_1 through 320_N to the memory controller 200. For example, the interface circuit 310 may temporarily store a data signal output from the first through $N^{th}$ non-volatile memories 320_1 through 320_N and may output the data signal as read data through the memory controller 200. That is, the interface circuit 310 may be configured to buffer the read data output to the host 100 to cover a difference between an operating speed between the interface circuit 310 and the host 100 and an operating speed between the interface circuit 310 and the first through $N^{th}$ non-volatile memories 320_1 through 320_N. Based on the buffering, the interface circuit 310 may reduce loading between the first through $N^{th}$ non-volatile memories 320_1 through 320_N and the memory controller 200. The interface circuit 310 may be referred to as a buffer chip or a buffer circuit.

According to various example embodiments, the memory controller 200 may include a training control unit 210. The training control unit 210 may perform training on the memory device 300, and the training may be an operation of determining a delay clock value for successive operating frequency conversion of the interface circuit 310. For example, the training control unit 210 may control a clock signal including a clock of one period to be applied to the first through $N^{th}$ non-volatile memories 320_1 through 320_N through the interface circuit 310 and skew information to be obtained according to a response signal. The training control unit 210 will be described below in detail.

Each of the first through $N^{th}$ non-volatile memories 320_1 through 320_N may include a memory cell array including a plurality of memory cells. For example, the plurality of memory cells may be flash memory cells. The following example embodiments of the inventive concepts will be described assuming that the plurality of memory cells are NAND flash memory cells. However, the inventive concepts are not limited thereto. According to various example embodiments, the plurality of memory cells may be various types of non-volatile memory cells. In an example embodiment, the plurality of memory cells may be resistive memory cells such as resistive random-access memory (RRAM) cells, phase-change random-access memory (PRAM) cells, or magnetoresistive random-access memory (MRAM) cells. In an example embodiment, the plurality of memory cells may be ferroelectric random-access memory (FRAM) cells or spin-transfer torque random-access memory (STT-RAM) cells. Each of the first through $N^{th}$ non-volatile memories 320_1 through 320_N may have a three-dimensional (3D) array structure. For example, the three-dimensional array structure may be applied to a charge trap flash (CTF) including an insulating film as a charge storage layer as well as a flash memory device including a conductive floating gate as a charge storage layer. In an example embodiment, each of the first through $N^{th}$ non-volatile memories 320_1 through 320_N may be based on a vertical stacked structure. For example, each of the first through $N^{th}$ non-volatile memories 320_1 through 320_N may correspond to a stacked structure including 100 or more layers. When each of the first through $N^{th}$ non-volatile memories 320_1 through 320_N is based on the vertical stacked structure, each of the first through $N^{th}$ non-volatile memories 320_1 through 320_N may be referred to as a vertical NAND (V-NAND) flash memory. In another embodiment, each of the first through $N^{th}$ non-volatile memories 320_1 through 320_N may have a cell-on-peri or cell-over-peri (CoP) structure.

Figure 2:
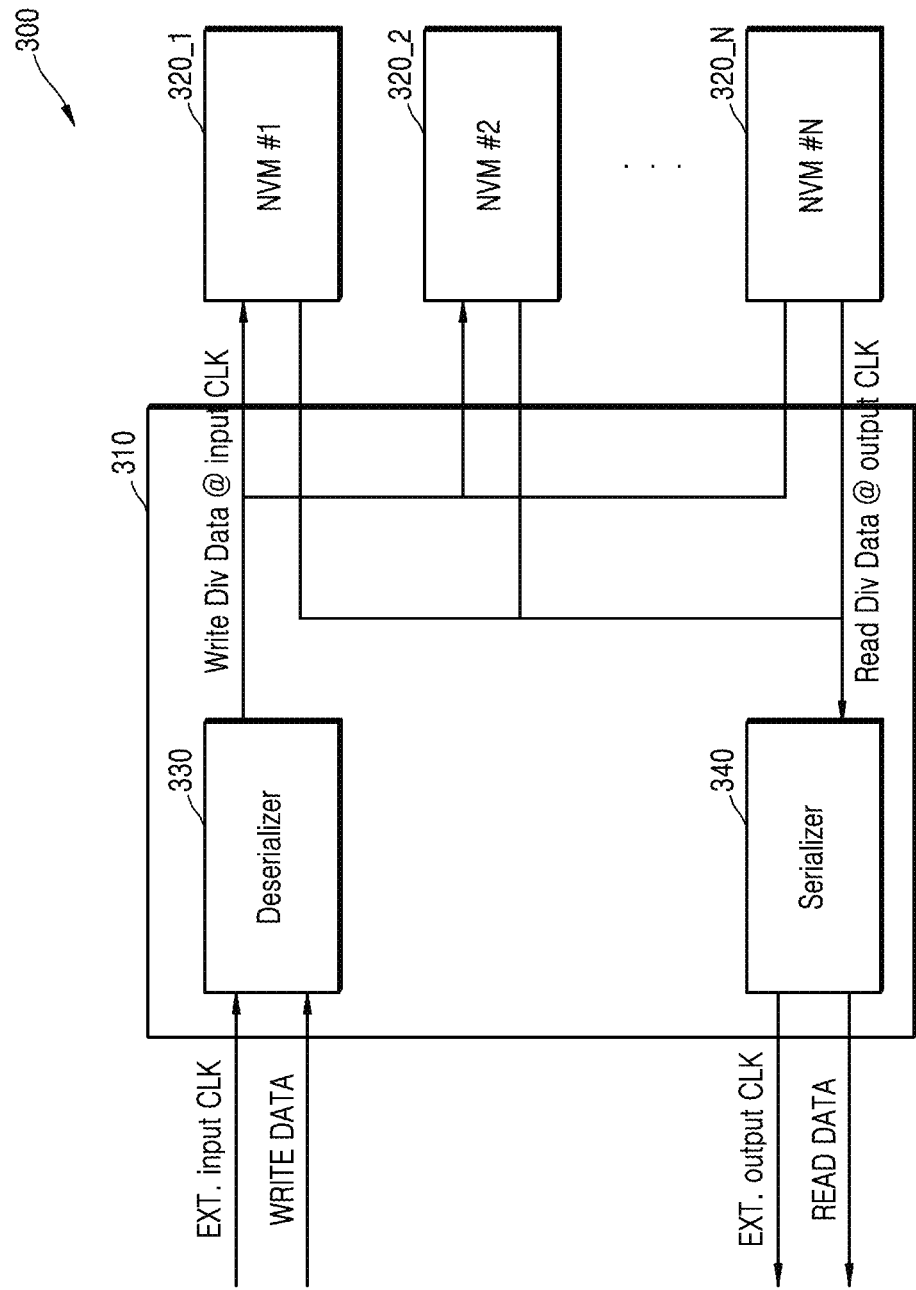
FIG. 2 is a diagram illustrating a memory device according to an example embodiment of the inventive concepts.

FIG. 2 is a diagram illustrating a memory device according to an example embodiment of the inventive concepts.

Referring to FIG. 2, the memory device 300 may include the interface circuit 310 and the first through $N^{th}$ non-volatile memories 320_1 through 320_N. The same description as that made with reference to FIG. 1 will be omitted.

According to various example embodiments, the interface circuit 310 may include a deserializer 330 and a serializer 340.

The deserializer 330 may divide data received from the memory controller 200 according to an input clock signal. The deserializer 330 may receive write data transmitted according to an external input clock signal EXT. input CLK. The deserializer 330 may divide the write data and separately write the write data to N non-volatile memories (i.e., the first through Nth non-volatile memories 3201 through 320_N). In this case, an operating frequency of the write data written to each of the non-volatile memories 320_1 through 320_N may be reduced to a value that is 1/N times a frequency of the external input clock signal EXT. input CLK. For example, assuming that the deserializer 330 divides the write data to the first non-volatile memory 3201 and the second non-volatile memory 320_2, the first non-volatile memory 3201 and the second non-volatile memory 3202 may receive the write data according to a clock of 500 MHz that is ½ times the external input clock signal EXT. input CLK. In this case, when data received by the first non-volatile memory 3201 and data received by the second non-volatile memory 3202 are added together, the write data may be obtained. For example, the data received by the first non-volatile memory 3201 may include packets corresponding to an odd numbered clock in the write data, and the data received by the second non-volatile memory 3202 may include packets corresponding to an even numbered clock in the write data.

The serializer 340 may combine data received from the first through $N^{th}$ non-volatile memories 320_1 through 320_N according to an output clock signal. The serializer 340 may receive data from the first through $N^{th}$ non-volatile memories 320_1 through 320_N, according to an internal clock signal. In this case, the internal clock signal may be a clock signal divided by the deserializer 330 as described above. For example, because clocks of signals input to and output from the interface circuit 310 are the same, frequencies of the external input clock signal EXT. input CLK input to the deserializer 330 and an external output clock signal EXT. output CLK to be output may be the same. Accordingly, the first through $N^{th}$ non-volatile memories 320_1 through 320_N may transmit read divided data to the serializer 340 according to an internal output clock signal output CLK that is 1/N times the external output clock signal EXT. output CLK to be output. For example, assuming that the deserializer 330 divides data to the first non-volatile memory 3201 and the second non-volatile memory 320_2, the first non-volatile memory 3201 and the second non-volatile memory 3202 may transmit divided data to the serializer 340 and may output the data as read data.

According to the above example embodiments, it is found that a frequency of a clock signal between the interface circuit 310 and the memory controller 200 and a frequency of a clock signal between the interface circuit 310 and the first through $N^{th}$ non-volatile memories 320_1 through 320_N are different from each other. That is, it is found that the memory device 300 may perform operating frequency conversion by using the interface circuit 310. When the first through $N^{th}$ non-volatile memories 320_1 through 320_N transmit read divided data Read Div Data to the serializer 340 and the serializer 340 combines the read divided data Read Div Data and generates and outputs read data, a time when the serializer 340 receives the read divided data Read Div Data may be important. However, because each of the first through $N^{th}$ non-volatile memories 3201 through 320_N just independently transmits pre-stored divided data in response to a read request signal and times taken for the first through $N^{th}$ non-volatile memories 320_1 through 320_N to transmit data may not be exactly the same, a synchronization method thereof may be required, which will be described in detail with reference to FIGS. 3 and 4.

Figure 3:
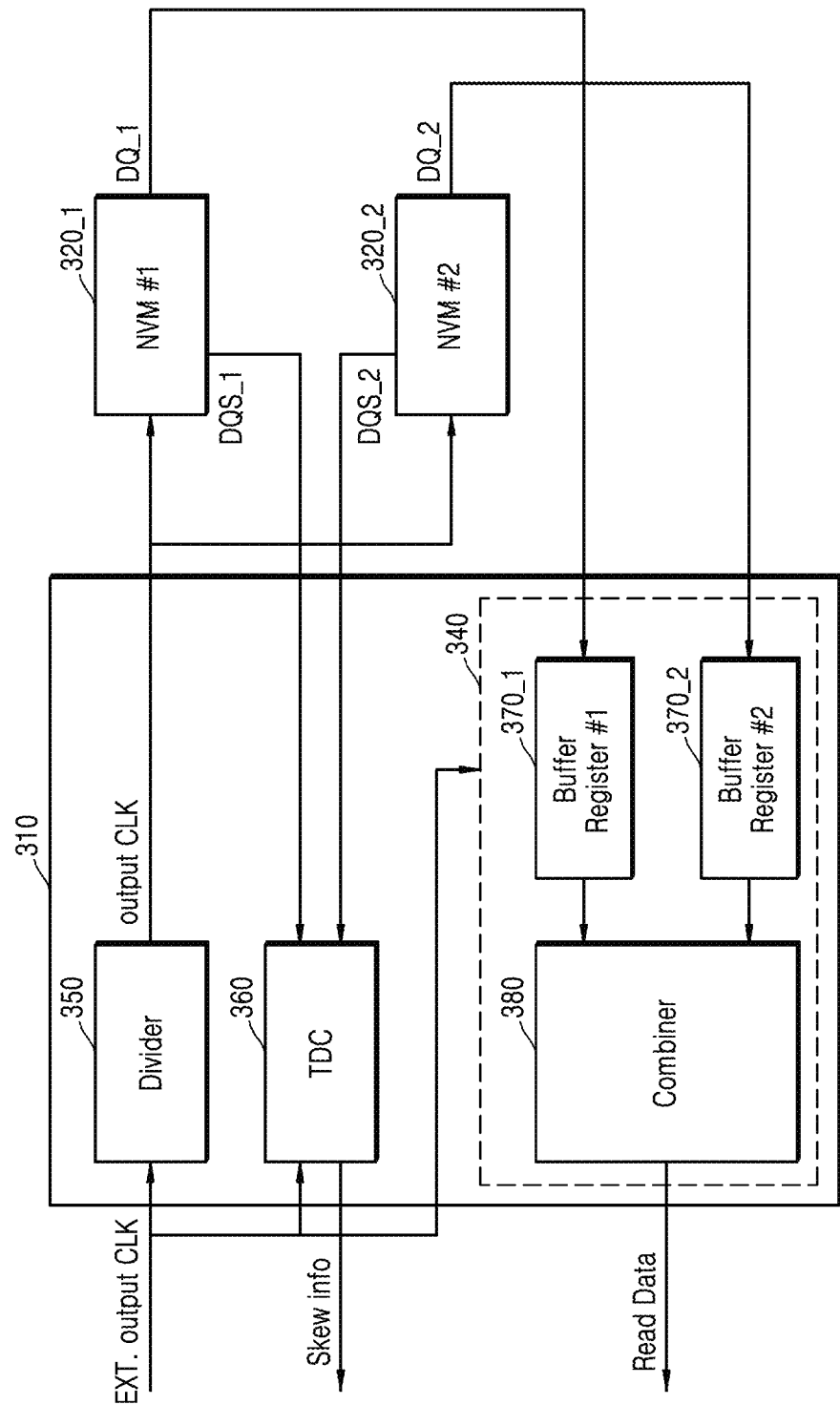
FIG. 3 is a diagram illustrating a memory device for outputting read data according to an example embodiment of the inventive concepts.

FIG. 3 is a diagram illustrating a memory device for outputting read data according to an example embodiment of the inventive concepts. The same description as that made above will be omitted.

The following will be described assuming that the plurality of non-volatile memories include the first non-volatile memory 320_1 and the second non-volatile memory 320_2. However, the inventive concepts are not limited thereto.

Referring to FIG. 3, the memory device 300 may output read data. The memory controller 200 may transmit the external output clock signal EXT. output CLK to the interface circuit 310 in response to a data read request from the host 100. In detail, the external output clock signal EXT. output CLK may be input to a divider 350 and a time-to-digital converter (TDC) 360 in the interface circuit 310.

The divider 350 may correspond to the deserializer 330 of FIG. 2. That is, the divider 350 may divide the external output clock signal EXT. output CLK and may transmit the internal output clock signal output CLK to the first nonvolatile memory 320_1 and the second non-volatile memory 320_2. The TDC 360 may perform a toggle operation in response to the external output clock signal EXT. output CLK.

The first non-volatile memory 320_1 and the second non-volatile memory 3202 may output stored data and a data strobe signal, in response to the internal output clock signal output CLK.

The first non-volatile memory 3201 may transmit a first data signal DQ_1 and a first data strobe signal DQS_1 to the serializer 340, in response to the internal output clock signal output CLK. Also, in order to identify a time difference between transmission timings of non-volatile memories, the first non-volatile memory 3201 may transmit the first data strobe signal DQS_1 to the TDC 360. The second non-volatile memory 3202 may transmit a second data signal DQ_2 and a second data strobe signal DQS_2 to the serializer 340, in response to the internal output clock signal output CLK. Also, in order to identify a time difference between transmission timings of non-volatile memories, the second non-volatile memory 3202 may transmit the second data strobe signal DQS_2 to the TDC 360.

The TDC 360 may receive the first data strobe signal DQS_1 and the second data strobe signal DQS_2 and may generate skew information based on the first data strobe signal DQS_1 and the second data strobe signal DQS_2. For example, it may be assumed that the TDC 360 receives the first data strobe signal DQS_1 at a first time, and receives the second data strobe signal DQS_2 at a second time later than the first time. In this case, the TDC 360 may calculate the first time, the second time, and a clock between the first time and the second time.

As described above, because a toggle operation is performed from a time when the external output clock signal EXT. output CLK is received, the TDC 360 may identify the first time according to the number of toggles at a time when the first data strobe signal DQS_1 is received. That is, the first time may be an intrinsic delay parameter taken for the first non-volatile memory 320_1 to receive a read request and output data in response to the read request.

Likewise, the TDC 360 may identify the second time according to the number of toggles until a time when the second data strobe signal DQS_2 is received. Accordingly, the second time may be an intrinsic delay parameter taken for the second non-volatile memory 320_2 to receive a read request and output the second data signal DQ_2 in response to the read request.

Also, the TDC 360 may calculate a difference in the number of toggles between the first time and the second time and may obtain the skew information. The term 'skew information' may refer to as a difference in a time taken to output data between non-volatile memories.

According to various example embodiments, the serializer 340 may include a plurality of buffer registers and a combiner 380. The plurality of buffer registers may respectively correspond to the plurality of non-volatile memories. Accordingly, the following will be described assuming that the plurality of buffer registers include a first buffer register 370_1 and a second buffer register 370_2. However, the inventive concepts are not limited thereto, and the plurality of buffer registers may include buffer registers according to various example embodiments.

The first buffer register 370_1 and the second buffer register 3702 may respectively correspond to the first non-volatile memory 3201 and the second non-volatile memory 320_2. For example, the first buffer register 370_1 may receive the first data signal DQ_1 from the first non-volatile memory 3201 and may temporarily store the first data signal DQ_1. The second buffer register 370_2 may receive the second data signal DQ_2 from the second non-volatile memory 320_2 and may temporarily store the second data signal DQ_2.

According to various example embodiments, the buffer registers may output temporarily stored data at a time that is delayed by a desired (or, alternatively, a predetermined) time or may simultaneously receive and output data, according to a control signal. For example, when there is no delay clock set for data output, the first buffer register 370_1 and the second buffer register 3702 may respectively receive the first data signal DQ_1 and the second data signal DQ2 and may directly output the first data signal DQ_1 and the second data signal DQ_2 to the combiner 380. In this case, because the first data signal DQ_1 is output at the first time earlier than the second data signal DQ_2, the combiner 380 may output the read data by using only the first data signal DQ_1 by a clock time corresponding to the skew information. However, because the first data signal DQ_1 includes packets corresponding to an odd numbered clock signal in write data, the output read data may correspond to inappropriate data.

Accordingly, in some example embodiments, in order to inhibit (or, alternatively, prevent) inappropriate read data from being output, the buffer registers may delay data output by a desired (or, alternatively, a predetermined) clock. Alternatively, in other example embodiments, the first buffer register 370_1 and the second buffer register 3702 may respectively output, to the combiner 380, the first data signal DQ_1 and the second data signal DQ_2 at a time that is delayed by a delay clock. The delay clock may correspond to a minimum clock guaranteeing that the first data signal DQ_1 and the second data signal DQ_2 are output at the same time by compensating for a clock difference between the first time and the second time. For example, the delay clock may be the same as the second time at which the second data signal DQ_2 that is a later output data signal is output, and may further include a margin clock considering a size of a buffer memory of each of the first buffer register 370_1 and the second buffer register 370_2.

Figure 4:
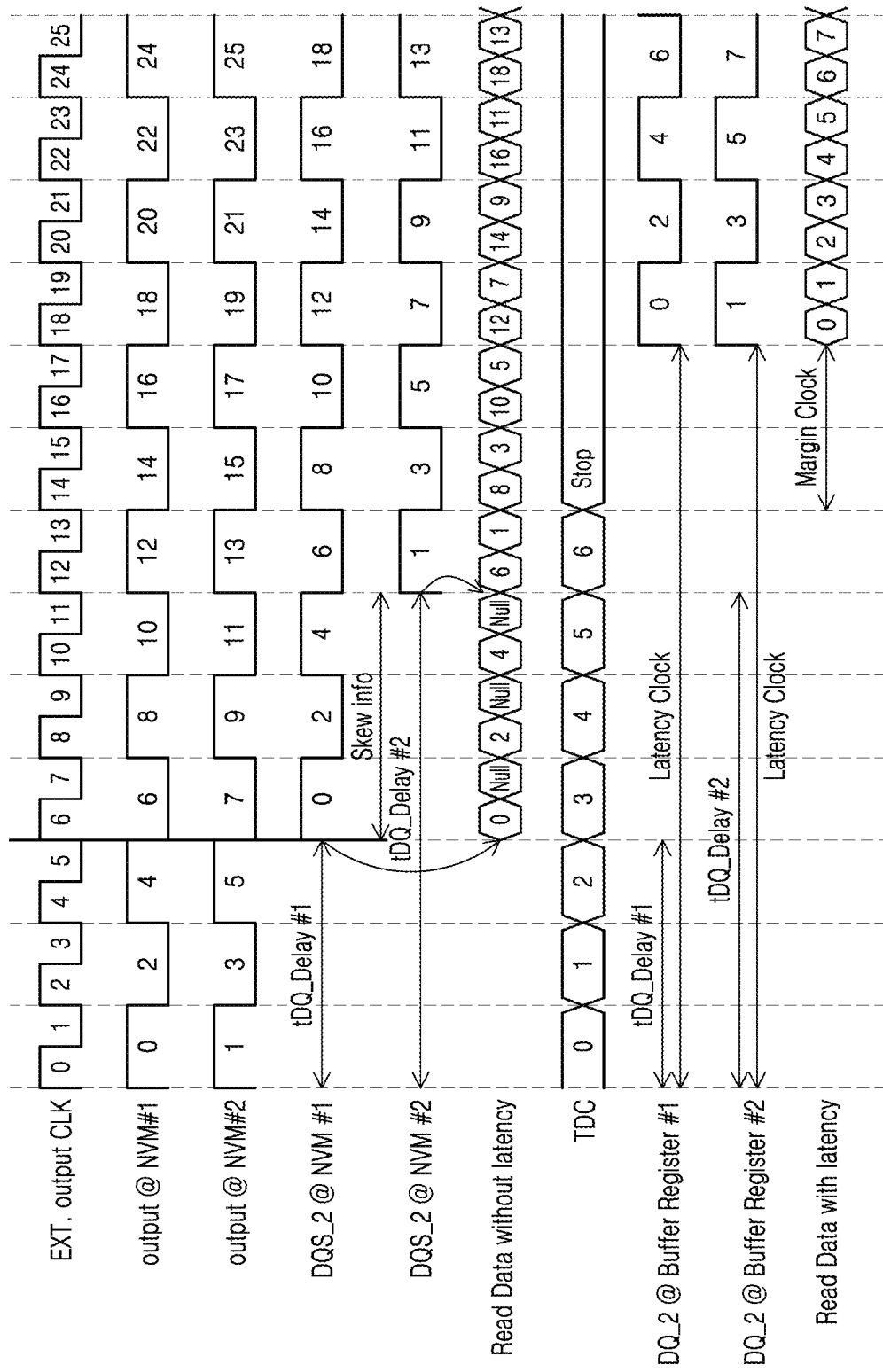
FIG. 4 is a clock diagram illustrating a memory device according to an example embodiment of the inventive concepts.

FIG. 4 is a timing clock diagram illustrating a memory device according to an example embodiment of the inventive concepts. The same description as that made above will be omitted.

Referring to FIG. 4, the external output clock signal EXT. output CLK may be toggled. A frequency of the external output clock signal EXT. output CLK may correspond to a maximum operating frequency. For example, the maximum operating frequency may be 1 GHz. However, the maximum operating frequency is not limited to 1 GHz, and according to various example embodiments, the maximum operating frequency may include a high frequency exceeding 1 GHz.

The external output clock signal EXT. output CLK may be transmitted by the divider 350 of FIG. 3 or the deserializer 330 of FIG. 2 to the first non-volatile memory 3201 and the second non-volatile memory 320_2. For convenience of explanation, it is assumed that there is no delay time or clock while the external output clock signal EXT. output CLK is divided by the divider 350 or the deserializer 330. Accordingly, while the external output clock signal EXT. output CLK is toggled, an internal output clock signal output @ NVM #1 transmitted to the first non-volatile memory 320_1 and an internal output clock signal output @ NVM #2 transmitted to the second non-volatile memory 3202 may be simultaneously toggled.

Referring to FIG. 3, the TDC 360 may receive the external output clock signal EXT. output CLK and may start a toggle operation in response to the external output clock signal EXT. output CLK. Because the TDC 360 performs a toggle operation in synchronization with a rising edge, a period in which the TDC 360 performs a toggle operation may be 2 times a period of the external output clock signal EXT. output CLK and may be the same as a period of the internal output clock signal output @ NVM #1 or output @ NVM #2.

The first non-volatile memory 3201 may receive the internal output clock signal output @ NVM #1 and may transmit the first data signal DQ_1 to the serializer 340 or the first buffer register 370_1 of the serializer 340 in response to the internal output clock signal output @ NVM #1. In this case, the first data strobe signal DQS_1 is also generated, and may be transmitted to the TDC 360.

The TDC 360 may receive the first data strobe signal DQS_1 from the first non-volatile memory 320_1 and may identify a first time tDQ_Delay #1. The TDC 360 may determine that a time taken for the first non-volatile memory 3201 to output data is 3 clocks. Also, the TDC 360 may determine that the first data signal DQ_1 is temporarily stored in the first buffer register 370_1.

The second non-volatile memory 3202 may receive the internal output clock signal output @ NVM #2 and may transmit the second data signal DQ_2 to the serializer 340 or the second buffer register 370_2 of the serializer 340 in response to the internal output clock signal output @ NVM #2. Like in the first non-volatile memory 3201, the second data strobe signal DQS_2 is also generated and may be transmitted to the TDC 360.

The TDC 360 may receive the second data strobe signal DQS_2 from the second non-volatile memory 320_2 and may identify a second time tDQ_Delay #2. The TDC 360 may determine that a time taken for the second non-volatile memory 3202 to output data is 6 clocks and the second data signal DQ_2 is temporarily stored in the second buffer register 370_2.

The TDC 360 may generate skew information. Because the second time corresponds to 6 clocks and the first time corresponds to 3 clocks, the skew information may indicate 3 clocks, and thus, may indicate that the second non-volatile memory 3202 outputs data 3 clocks later than the first non-volatile memory 3201.

According to various example embodiments, when a delay clock is not set to the first buffer register 370_1 and the second buffer register 3702 (Read Data without latency), it is found that inappropriate read data is output. From a time when 3 clocks elapse, the first buffer register 370_1 may output stored data at a frequency of the external output clock signal EXT. output CLK. Because the second buffer register 3702 may output the second data signal DQ_2 from a time when 6 clocks elapse, there may be no data stored in the second buffer register 370_2. In FIG. 4, it is found that read data with no set delay clock is [0, null, 2, null, 4, null, 6, 1, 8, 3, 10, 5, . . . ].

According to various example embodiments, when a delay clock is set to the first buffer register 370_1 and the second buffer register 3702 (Read Data with latency), it is found that normal read data is output. The first buffer register 370_1 and the second buffer register 3702 may respectively output the first data signal DQ_1 and the second data signal DQ_2 that are temporarily stored from a time when a delay clock elapses. Because a clock time delayed by each buffer register is the same, no matter how late data output from the second non-volatile memory 320_2 occurs, it may be guaranteed that the second data signal DQ_2 is temporarily stored in the second buffer register 370_2. Referring to FIG. 4, when a delay clock is set, it is found that read data is [0. 1. 2. 3. 4. 5. 6. 7 . . . ].

According to various example embodiments, a delay clock may further include a delay time corresponding to a margin clock. An operating frequency of data input from a non-volatile memory is merely ½ times a frequency of an operating frequency at which a buffer register outputs data to the combiner 380. Accordingly, when a size of the buffer register is large enough, no problem occurs, but when a size of the buffer register is not large enough, it may be preferable to additionally provide a margin clock corresponding to a desired (or, alternatively, a predetermined) number of clocks in order to inhibit (or, alternatively, prevent) the buffer register from being empty.

Figure 5:
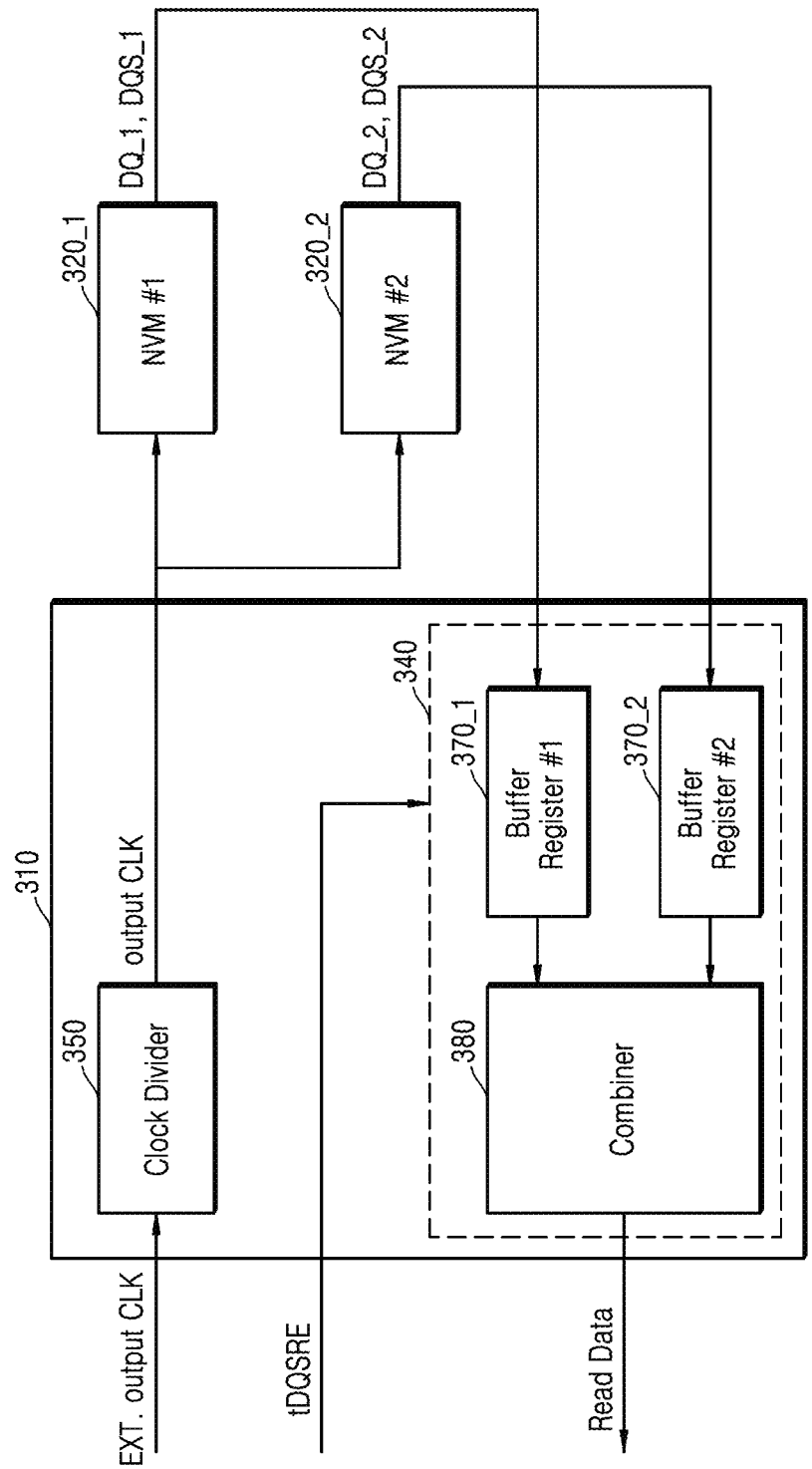
FIG. 5 is a diagram illustrating a memory device for outputting read data according to another example embodiment of the inventive concepts.

FIG. 5 is a diagram illustrating a memory device for outputting read data according to another example embodiment of the inventive concepts. The same description as that made with reference to FIG. 3 will be omitted.

Referring to FIG. 5, the interface circuit 310 may not include the TDC 360. Alternatively, the memory controller 200 may not include the training control unit 210. In this case, since skew data may not be generated, synchronization may not rely on a delay clock based on the skew information as described with reference to FIGS. 3 and 4. However, in some example embodiments, even when the memory controller 200 does not include the training control unit 210 or the interface circuit 310 does not include the TDC 360, normal read data may be output at a maximum operating frequency.

According to various example embodiments, the memory controller 200 may provide a maximum delay value tDQSRE to the interface circuit 310 or the first and second non-volatile memories 320_1 and 320_2, where tDQSRE is a timing parameter of the memory indicating data access time. The maximum delay value that is a value which the first and second non-volatile memories 320_1 and 320_2 must satisfy may refer to a maximum delay clock time guaranteeing data output. That is, at a time when the maximum delay time elapses, the first non-volatile memory 320_1 and the second non-volatile memory 3202 have to respectively output the first data signal DQ_1 and the second data signal DQ_2.

According to an example embodiment, the memory controller 200 may transmit the maximum delay value tDQSRE to a buffer register. That is, in response to the maximum delay value tDQSRE, until a clock corresponding to the maximum delay value elapses, the first buffer register 370_1 and the second buffer register 370_2 may temporarily store data received from the first non-volatile memory 320_1 and the second non-volatile memory 320-2 and may wait to output the data as read data through the combiner 380.

According to another example embodiment, the memory controller 200 may transmit the maximum delay value tDQSRE to a non-volatile memory. That is, from a time when the internal output clock signal output CLK is received, the first non-volatile memory 320_1 and the second non-volatile memory 320_2 may wait so as not to output a data signal or a data strobe signal until a clock corresponding to the maximum delay value tDQSRE elapses.

That is, when a clock corresponding to the maximum delay value for guaranteeing that the non-volatile memory outputs data is delayed, a data signal of only one of the first buffer register 370_1 and the second buffer register 370_2 may be prevented from being stored and output, and thus, the TDC 360 or the training control unit 210 may be omitted.

Figure 6:
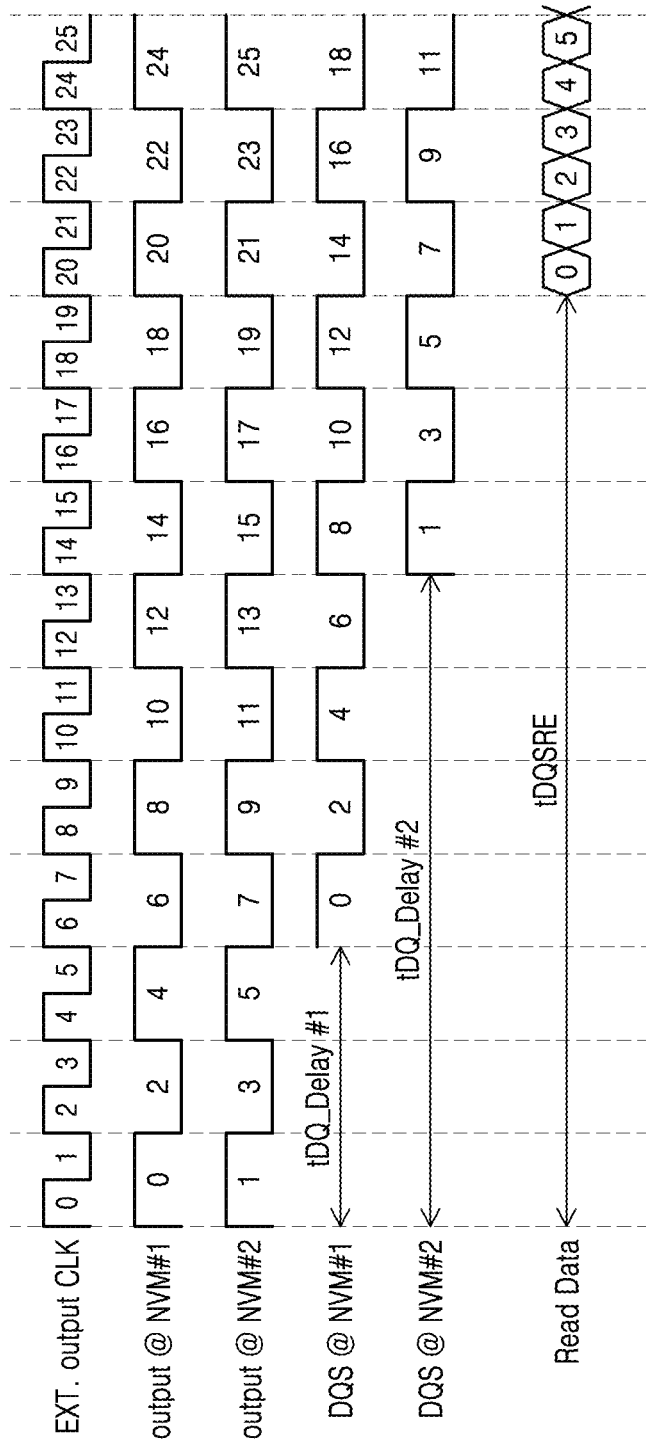
FIG. 6 is a clock diagram illustrating a memory device according to an example embodiment of the inventive concepts.

FIG. 6 is a clock diagram illustrating a memory device according to an example embodiment of the inventive concepts. The same description as that made with reference to FIG. 4 will be omitted.

Referring to FIG. 6, because the interface circuit 310 does not include the TDC 360, it is found that there is no waveform related to the TDC 360.

Because the TDC 360 is not provided, the memory controller 200 may not count a clock tDQ_Delay #1 required for the first non-volatile memory 3201 to output data or a clock tDQ_Delay #2 required for the second non-volatile memory 3202 to output data.

According to an example embodiment, after the maximum delay value tDQSRE elapses, the memory controller 200 may request the first non-volatile memory 320_1 or the second non-volatile memory 3202 to output a data signal and a data strobe signal.

According to another embodiment, the memory controller 200 may transmit the maximum delay value tDQSRE to the first buffer register 370_1 and the second buffer register 370_2 and may request the first buffer register 370_1 and the second buffer register 370_2 to temporarily store the first data signal DQ_1 or the second data signal DQ_2 and to wait until the maximum delay value tDQSRE elapses. After the maximum delay value tDQSRE elapses, the first buffer register 370_1 and the second buffer register 3702 may output data to the combiner 380. At a time when the maximum delay value tDQSRE elapses, data is stored in all buffer registers, and thus, normal read data may be output.

Figure 7:
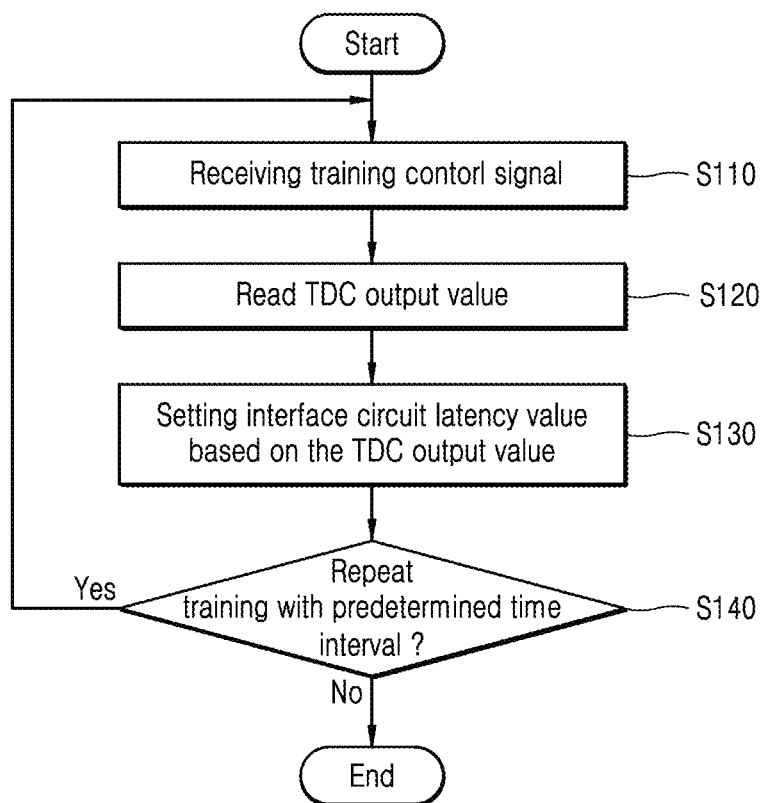
FIG. 7 is a flowchart illustrating an operation order of a memory device according to example embodiment of the inventive concepts.

FIG. 7 is a flowchart illustrating an operation order of a memory device according to an example embodiment of the inventive concepts.

Referring to FIG. 7, in operation S110, the memory device 300 may receive a training control signal. The training control signal may be generated and transmitted by the training control unit 210 of the memory controller 200. That is, when the training control unit 210 generates the training control signal, the memory controller 200 may transmit a clock signal including a single clock along with the training control signal to the interface circuit 310.

In operation S120, the memory device 300 may read a TDC output value. The clock signal is not a signal for a process of writing or reading actual data, and may be a signal for obtaining clock response waveforms of the first non-volatile memory 320_1 and the second non-volatile memory 320_2 and obtaining a first time required for the first non-volatile memory 320_1 to output data, a second time required for the second non-volatile memory 320_2 to output data, and skew information between the first time and the second time. Accordingly, when the clock signal is applied, the memory device 300 may obtain values of the first time, the second time, and the skew information as an output value of the TDC 360.

In operation S130, the memory device 300 may set a delay value of the interface circuit 310 based on the output value of the TDC 360. The memory device 300 may set a delay clock value by further delaying a time by a margin clock value from the second time. The margin clock value may be variably set based on memory sizes of the first buffer register 370_1 and the second buffer register 370_2.

In operation S140, the memory device 300 may determine whether to repeat training at desired (or, alternatively, at pre-defined) time intervals. According to various example embodiments, training using the clock signal may be performed at desired (or, alternatively, at pre-defined) time intervals or may be performed only one time at a memory driving time.

When the memory device 300 is continuously driven, a surrounding environment such as an internal temperature or a voltage may be different from that at an initial stage of operation. In this case, a time when the first non-volatile memory 3201 outputs data and a time when the second non-volatile memory 3202 outputs data may vary according to a change in the internal voltage or the voltage. Accordingly, the memory device 300 may perform training using the clock signal at desired (or, alternatively, at pre-defined) time intervals, may continuously update the first time, the second time, and the skew information, and may variably set the delay clock value according to the updated information. Although training is performed at pre-defined time intervals in the above example embodiment, the inventive concepts are not limited thereto. In another example embodiment, when the internal temperature of the memory device 300 exceeds a set (or, alternatively, a preset) critical temperature, because a time required to output data is likely to change, the memory device 300 may perform updating by performing the training using the clock signal.

Figure 8:
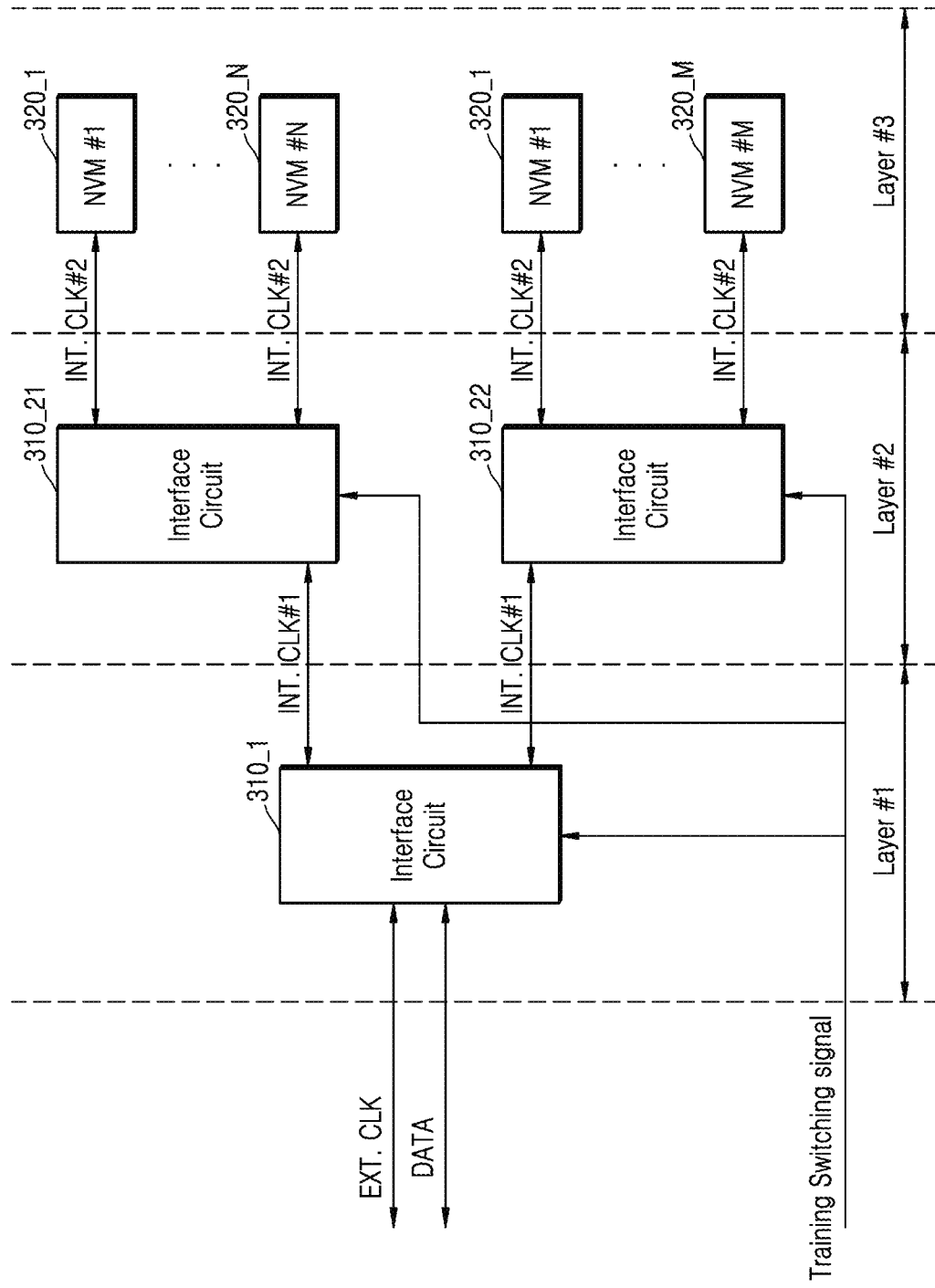
FIG. 8 is a diagram illustrating a memory device having a hierarchical structure according to an example embodiment of the inventive concepts.

FIG. 8 is a diagram illustrating a memory device having a hierarchical structure according to an example embodiment of the inventive concepts.

Referring to FIG. 8, the memory device 300 may include interface circuits having a hierarchical structure. The following will focus on a first interface circuit 310_1 of a layer 1, and a second interface circuit 310_21 and a third interface circuit 310_22 of a layer 2. However, the inventive concepts are not limited thereto, and the number of layers and the number of interface circuits included in each layer may be modified in various ways.

According to various example embodiments, the first interface circuit 310_1 may be located in the layer 1. The layer 1 that is an uppermost layer may directly receive an external clock signal EXT. CLK and a data signal DATA from the memory controller 200. The first interface circuit 310_1 may divide the external clock signal EXT. CLK received from the memory controller 200 into first internal clock signals INT. CLK #1, and may transmit the first internal clock signals INT. CLK #1 to the second interface circuit 310_21 and the third interface circuit 310_22 located in the layer 2. Because the external clock signal EXT. CLK is divided into two first internal clock signals INT. CLK #1, a frequency of the first internal clock signals INT. CLK #1 may be ½ times a frequency of the external clock signal EXT. CLK.

According to various example embodiments, the second interface circuit 310_21 and the third interface circuit 310_22 may be located in the layer 2. The layer 2 that is an intermediate layer may perform signaling between an upper layer and a lower layer. The second interface circuit 310_21 may be connected to N non-volatile memories 320_1 through 320_N, and the third interface circuit 310_22 may be connected to M non-volatile memories 320_1 through 320_M. The second interface circuit 310_21 may divide and transmit the first internal clock signals INT. CLK #1 to the first through $N^{th}$ non-volatile memories 320_1 through 320_N in a layer 3. For example, the second interface circuit 31021 may divide the received first internal clock signal INT. CLK #1 into N second internal clock signals INT. CLK #2, and a frequency of the N second internal clock signals INT. CLK #2 may be 1/N times a frequency of the first internal clock signal INT. CLK #1. For example, assuming that a frequency of the external clock signal EXT. CLK is a maximum operating frequency and the maximum operating frequency is 1 GHz, an operating frequency sensed by each non-volatile memory may be merely ½N times 1 GHz.

According to various example embodiments, the memory controller 200 may control interface circuits of the layer 1 and the layer 2 to be turned on/off by using a training switching signal. For example, the training switching signal may be as shown in Table 1.

TABLE

| Training switching signal | Layer 1 | Layer 2 |
|---|---|---|
| 11 | Dividing | Dividing |
| 10 | Dividing | Bypassing |
| 01 | Bypassing | Dividing |
| 00 | Bypassing | Bypassing |

Referring to Table 1, although the training switching signal is a 2-bit signal, this is merely an example. As the number of layers increases, bits allocated to the training switching signal may increase.

A change in a frequency through each layer according to bits indicated by the training switching signal may be as shown in Table 2. (where N and M are limited to 2)

TABLE 2

| Training signal bit | External - Layer 1 | Layer #1 - Layer #2 | Layer #2 - Layer #3 |
|---|---|---|---|
| 11 | 1 | 0.5 | 0.25 |
| 10 | 1 | 0.5 | 0.5 |
| 01 | 1 | 1 | 0.5 |
| 00 | 1 | 1 | 1 |

That is, when an input operating frequency is not high, the memory controller 200 may not reduce a frequency by setting the training switching signal to "00", in order not to waste an additional process. Also, as an input operating frequency is closer to a maximum operating frequency, the memory controller 200 may adaptively control to change the training switching signal to "01" or "10" or to set the training switching signal to "11", in order to reduce as much as possible an operating frequency sensed by a non-volatile memory.

Figure 9:
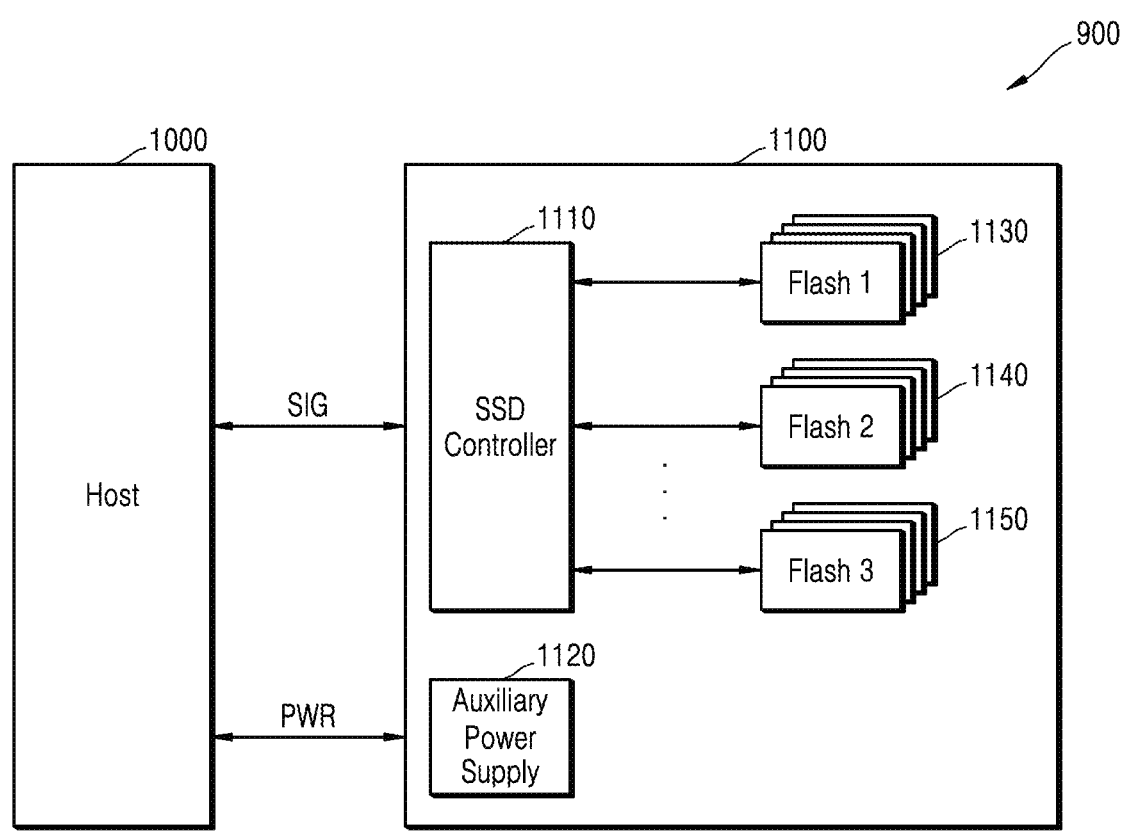
FIG. 9 is a diagram illustrating a solid-state drive (SSD) system according to an example embodiment of the inventive concepts.

FIG. 9 is a diagram illustrating a solid-state drive (SSD) system according to an example embodiment of the inventive concepts.

Referring to FIG. 9, an SSD system 900 may include a host 1000 and an SSD 1100. The SSD 1100 may transmit/receive a signal to/from the host 1000 through a signal connector and may receive power through a power connector. The SSD 1100 may include an SSD controller 1110, an auxiliary power supply 1120, and a plurality of memory devices 1130, 1140, and 1150. The plurality of memory devices 1130, 1140, and 1150 may be vertical stacked NAND flash memory devices. In this case, at least one of the plurality of memory devices 1130, 1140, and 1150 may operate at a maximum operating frequency with the host 1000 by using a delay clock value described with reference to FIGS. 1 through 8 and to transmit/receive data at a lower operating frequency between the SSD controller 1110 and the plurality of memory devices 1130, 1140, and 1150.

The memory controller 200 and the interface circuit 310 and the sub-components thereof including the training control unit 210, deserializer and serializer 340 may include processing circuitry including, but is not limited to, a central processing unit (CPU), an arithmetic logic unit (ALU), a digital signal processor, a microcomputer, a field programmable gate array (FPGA), a programmable logic unit, a microprocessor, application-specific integrated circuit (ASIC), etc. Further the buffer registers 3701, 3702 may include volatile memory such as a dynamic random access memory (DRAM) or a static RAM (SRAM). The processing circuitry may execute instructions that configure the processing circuitry as special purpose processing circuitry that adaptively adjusts an internal operating frequency.

While the inventive concepts have been particularly shown and described with reference to some example embodiments thereof, it will be understood that various changes in form and details may be made therein without departing from the spirit and scope of the following claims.

What is claimed is:

1. A memory system comprising:
a memory controller configured to transmit, to a host device, read data according to a first clock, in response to read command received from the host device; and
a memory device including,
a first NVM,
a second NVM, and
an interface circuit connected between the memory controller and the first NVM and the second NVM, the interface circuit configured to,
receive, from the memory controller, the first clock, and to generate and transmit, a second clock which is divided from the first clock based on a number of NVMs, to each of the first NVM and the second NVM,
receive, at a first time, a first data strobe signal generated by the first NVM,
receive, at a second time, a second data strobe signal generated by the second NVM,
identify a skew based on the first time and the second time,
identify a first time delay associated with outputting data from the first NVM and a second time delay associated with outputting data from the second NVM based on the skew, and
generate and transmit, to the memory controller, the read data by,
temporarily storing first divided read data received from the first NVM and second divided read data received from the second NVM in a first buffer register and a second buffer register, respectively,
outputting the first divided read data from the first NVM based on the first time delay and the second divided read data from the second NVM based on the second time delay,
combining the first divided read data that was output based on the first time delay and the second divided read data that was output based on the second time delay to generate the read data, and
transmitting the read data to the memory controller.

2. The memory system of claim 1, wherein, when the first time precedes the second time,
the first delay time includes the skew and a delay margin time, and
the second delay time includes the delay margin time.

3. The memory system of claim 1, wherein the serializer is configured to concurrently receive the first divided read data from the first NVM and the second divided read data from the second NVM.

4. The memory system of claim 1, wherein
the first NVM is configured to transmit the first data strobe signal to the TDC, and transmit the first data strobe signal and the first divided read data to the first buffer register, and
wherein the second NVM is configured to transmit the second data strobe signal to the TDC, and transmit the second data strobe signal and the second divided read data to the second buffer register.

5. A memory system comprising:
a memory controller configured to receive a first clock and a read command from a host device, transmit a first control signal or a second control signal to an interface circuit, transmit read data according to the first clock to the host device; and
a memory device including a first NVM, a second NVM, and the interface circuit which is connecting between the memory controller and the first NVM and the second NVM,
wherein the interface circuit is configured to:
in response to receiving the first control signal from the memory controller, generate and transmit, a second clock which is divided from the first clock based on a number of NVMs, to each of the first NVM and the second NVM,
in response to receiving the second control signal from the memory controller, transmit the first clock received from the memory controller to the first NVM and the second NVM,
receive, at a first time, a first data strobe signal generated by the first NVM,
receive, at a second time, a second data strobe signal generated by the second NVM,
identify a skew based on the first time and the second time, and
generate and transmit, to the memory controller, the read data by combining first divided read data from the first NVM and second divided read data from the second NVM based on the skew, and wherein the memory controller is configured to transmit one of the first control signal and the second control signal, to the interface circuit, based on a value of the first clock.

6. The memory system of claim 5, wherein the interface circuit further comprises a serializer including a first buffer register, a second buffer register, and a combiner, and wherein the first buffer register corresponds to the first NVM, and the second buffer register corresponds to the second NVM.

7. The memory system of claim 6, wherein the interface circuit further comprises a TDC (time to digital converter) configured to identify the skew, wherein the skew is calculated by a time difference between the first time and the second time, and wherein the interface circuit is further configured to calculate a first delay time for the first buffer register, and a second delay time for the second buffer register.

8. The memory system of claim 7, wherein the interface circuit is further configured to:

delay outputting the first divided read data from the first buffer register to the serializer for the first delay time, delay outputting the second divided read data from the second buffer register to the serializer for the second delay time, and wherein the first delay time is different from the second delay time.

9. The memory system of claim 8, wherein, when the first time precedes the second time, the first delay time includes the skew and a delay margin time, and wherein the second delay time includes the delay margin time.

10. The memory system of claim 8, wherein the serializer is configured to concurrently receive the first divided read data from the first NVM and the second divided read data from the second NVM.

11. The memory system of claim 7, wherein the first NVM is configured to transmit the first data strobe signal to the TDC, and transmit the first data strobe signal and the first divided read data to the first buffer register, and wherein the second NVM is configured to transmit the second data strobe signal to the TDC, and transmit the second data strobe signal and the second divided read data to the second buffer register.

12. The memory system of claim 5, wherein:

if a frequency of the first clock is close to a maximum operating frequency, the memory controller is configured to transmit the first control signal to the interface circuit, and if a frequency of the first clock is not close to the maximum operating frequency, the memory controller is configured to transmit the second control signal to the interface circuit.

13. An operating method of a memory device including a first NVM, a second NVM and an interface circuit connected to each of the first NVM and the second NVM, the method comprising:

receiving, by the interface circuit, a first clock signal;

in response to receiving a first control signal from a memory controller, generating and transmitting, by the interface circuit, a second clock signal, which is divided from the first clock signal based on a number of NVMs, to each of the first NVM and the second NVM;

in response to receiving a second control signal from the memory controller, transmitting, by the interface circuit, the first clock received from the memory controller to the first NVM and the second NVM;

receiving, by the interface circuit at a first time, a first data strobe signal generated by the first NVM in response to the first NVM receiving of the second clock signal from the interface circuit;

receiving, by the interface circuit at a second time, a second data strobe signal generated by the second NVM in response to the second NVM receiving of the second clock signal from the interface circuit;

identifying, by the interface circuit, a skew based on the first time and the second time; and generating and transmitting, to the memory controller, read data by combining first divided read data from the first NVM and second divided read data from the second NVM based on the skew, and wherein the interface circuit is configured to receive one of the first control signal and the second control signal from the memory controller based on a value of the first clock.

14. The operating method of claim 13, further comprising:

transmitting, by the first NVM, the first divided read data to the interface circuit;

transmitting, by the second NVM, the second divided read data to the interface circuit;

generating, by the interface circuit, the read data based on the first divided read data and the second divided read data; and outputting, by the interface circuit, the read data based on the first clock signal.

15. The operating method of claim 14, wherein:

the first data strobe signal is transmitted based on the second clock signal, the second data strobe signal is transmitted based on the second clock signal, the first divided read data is transmitted based on the second clock signal, and the second divided read data is transmitted based on the second clock signal.

16. The operating method of claim 14, wherein the generating of the read data further comprises:

calculating, by the interface circuit, a first delay time for the first divided read data, based on the skew; and calculating, by the interface circuit, a second delay time for the second divided read data, based on the skew, wherein if the interface circuit receives the first data strobe signal faster than the second data strobe signal, the first delay time is greater than the second delay time.

17. The operating method of claim 16, further comprising:

delaying, by the interface circuit, the first divided read data during the first delay time from a time the first divided read data is received by the interface circuit;

delaying, by the interface circuit, the second divided read data during the second delay time from a time the second divided read data is received by the interface circuit; and combining the first divided read data and the second divided read data in response to elapse each of the first delay time and the second delay time.

* * * * *